United States Patent
Demonica et al.

(10) Patent No.: US 7,963,787 B2
(45) Date of Patent: Jun. 21, 2011

(54) ELECTRONIC ASSEMBLY AND METHOD OF MAKING SAME

(75) Inventors: Michael J. Demonica, Cortland, OH (US); Michael E. Francis, Beaver Falls, PA (US)

(73) Assignee: Delphi Technologies, Inc., Troy, MI (US)

(*) Notice: Subject to any disclaimer, the term of this patent is extended or adjusted under 35 U.S.C. 154(b) by 196 days.

(21) Appl. No.: 12/148,571

(22) Filed: Apr. 21, 2008

(65) Prior Publication Data

US 2009/0203237 A1    Aug. 13, 2009

Related U.S. Application Data

(60) Provisional application No. 60/931,394, filed on May 22, 2007.

(51) Int. Cl.
*H01R 13/62* (2006.01)

(52) U.S. Cl. .......................................... 439/326; 439/79

(58) Field of Classification Search ................... 439/79, 439/326, 352–358, 567, 571, 701
See application file for complete search history.

(56) References Cited

U.S. PATENT DOCUMENTS

| | | | | |
|---|---|---|---|---|
| 4,457,573 | A * | 7/1984 | Bailey et al. | 439/557 |
| 5,035,641 | A * | 7/1991 | Van-Santbrink et al. | 439/329 |
| 5,230,633 | A * | 7/1993 | Hisatomi et al. | 439/79 |
| 5,690,513 | A | 11/1997 | Fink | |
| 5,820,387 | A * | 10/1998 | Borisch et al. | 439/79 |
| 6,435,897 | B1 * | 8/2002 | Paul et al. | 439/374 |
| 6,537,086 | B1 * | 3/2003 | Mac Mullin | 439/79 |
| 6,863,545 | B2 * | 3/2005 | Peloza | 439/79 |
| 6,902,432 | B2 * | 6/2005 | Morikawa et al. | 439/607.41 |
| 6,974,344 | B2 * | 12/2005 | Comerci | 439/329 |

* cited by examiner

*Primary Examiner* — Thanh-Tam T Le
(74) *Attorney, Agent, or Firm* — Thomas N. Twomey

(57) ABSTRACT

An electronic assembly comprises a printed circuit board that has an electronic component that is attached mechanically and electrically to the printed circuit board by soldering. A plastic header connector covers the electronic component and provides a socket for the electronic component when the plastic header connector is attached to the printed circuit board solely by portions of the plastic header connector.

9 Claims, 6 Drawing Sheets

ELECTRONIC ASSEMBLY AND METHOD OF MAKING SAME

Priority of Provisional Patent Application No. 60/931,394 filed May 22, 2007 is claimed.

BACKGROUND OF THE INVENTION

This invention relates generally to an electronic assembly and more particularly to an electronic assembly that includes a header connector that is attached to a printed circuit board.

Printed circuit boards are often equipped with a header connector for receiving a mating electrical connector on the end of a wiring harness. Such header connector connectors for printed circuit boards generally comprise a plastic connector body that houses male terminals. The male terminals have projecting tails that extend through holes of the printed circuit board. These projecting tails are soldered to the printed circuit board to make electrical connections as well as attach the header connector to the printed circuit board mechanically. The plastic connector body may have plastic flex locks to hold the header connector in place until the solder process is complete. See for instance U.S. Pat. No. 5,690,513 issued to Randy Lynn Fink et al. Nov. 25, 1997.

Electronic components are usually mounted on the printed circuit board independently of the header connector using solder reflow techniques. Since the independently mounted electronic devices are not contained within the header connector, the soldering of the electronic device does not secure the header connector to the printed circuit board. Attempts to secure a plastic header connector without soldering has not produced a reliably held and positioned header connector.

SUMMARY OF THE INVENTION

This invention provides an electronic assembly that includes an electronic component on a printed circuit board and a header connector for the electronic component that can be attached to a printed circuit board reliably, accurately and inexpensively by isolating the plastic header connector from the soldering process thereby eliminating the need for high temperature plastic material for the connector body.

DETAILED DESCRIPTION OF THE PREFERRED EMBODIMENTS

Figure 1:
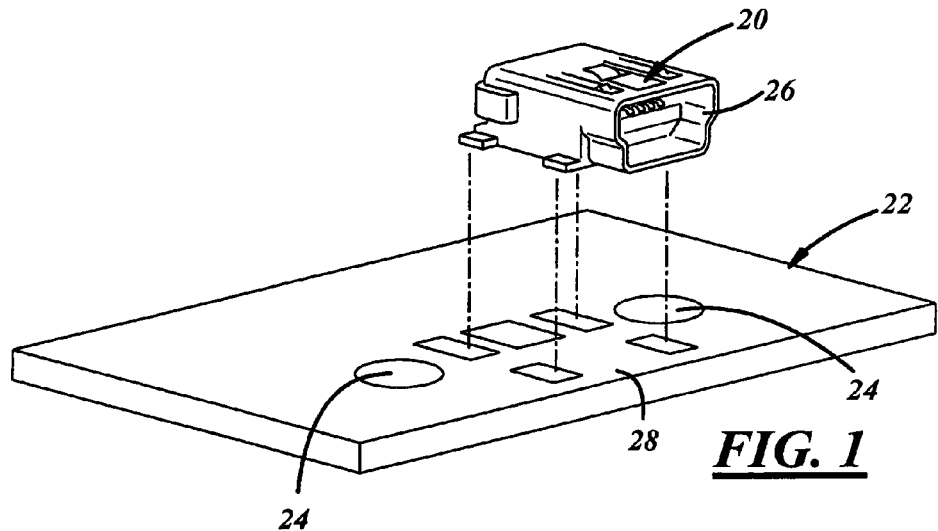
FIGS. 1 and 2 are perspective views of an electronic component being attached to a printed circuit board.
Figure 2:
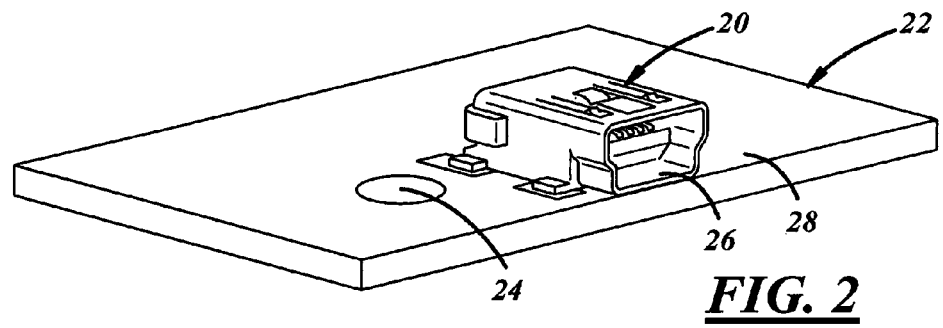

Referring now to FIGS. 1 and 2 an electronic component 20 is attached mechanically and electrically to a printed circuit board 22 having solder pads by soldering mounting portions of the electronic component to the solder pads using a solder reflow or other conventional soldering technique. The printed circuit board has two mounting holes 24 near the respective opposite sides of the electronic component 20 and the electronic component 20 has a receptacle 26 that is at or near a front edge 28 of the printed circuit board 22.

Figure 3:
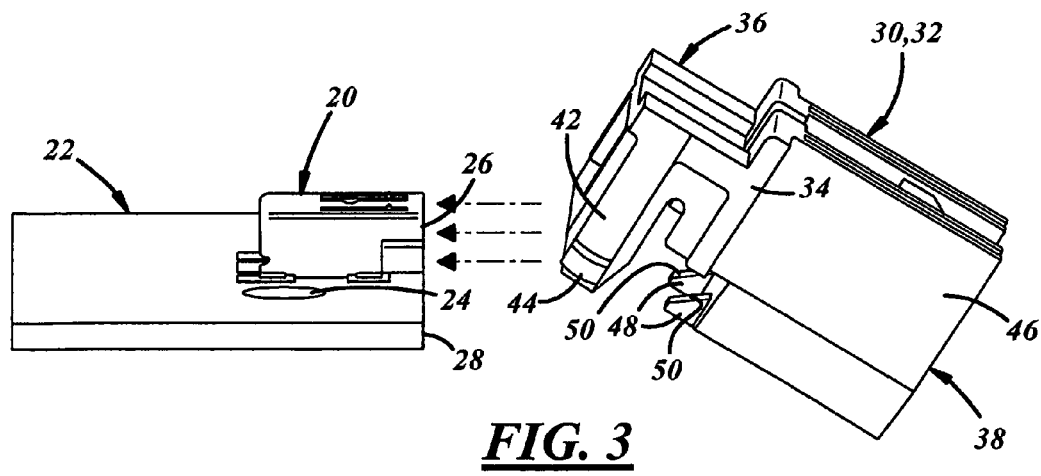
FIG. 3 is a perspective view of a header connector being attached to the printed circuit board and electronic component shown in FIGS. 1 and 2.

FIG. 3 is a perspective view of a header connector 30 being attached to the sub-assembly comprising printed circuit board 22 and electronic component 20 shown in FIGS. 1 and 2. The header connector 30 is a molded plastic component 32 that is attached to the printed circuit board 22 solely by portions of the molded plastic component 32 as explained below.

Figure 8:
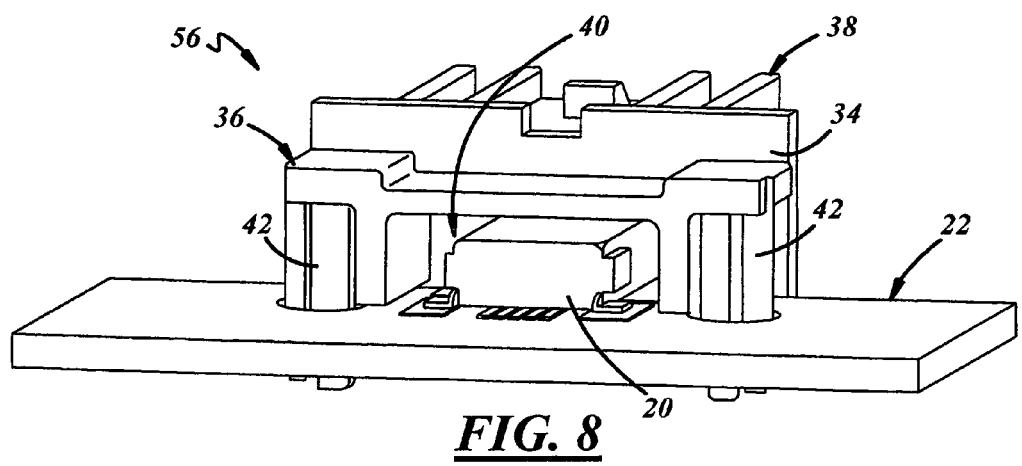
FIG. 8 is a rear view of the electronic assembly shown in FIGS. 6 and 7.

The plastic component 32 comprises a medial wall 34 located between a rearward portion 36 and a forward portion 38. The rearward portion 36 has a bottomless chamber 40 for covering the electronic component 20 and two flexible attachment legs 42 on opposite sides of the bottomless chamber 40 as best shown in FIG. 8. The attachment legs 42 are preferably split longitudinally for flexibility and have lateral wings 44 at their distal ends that are pushed through the attachment holes 24 and engage the underside of the printed circuit board 22 to fasten the rearward portion 36 of the plastic component 32 to the printed circuit board.

Figure 9:
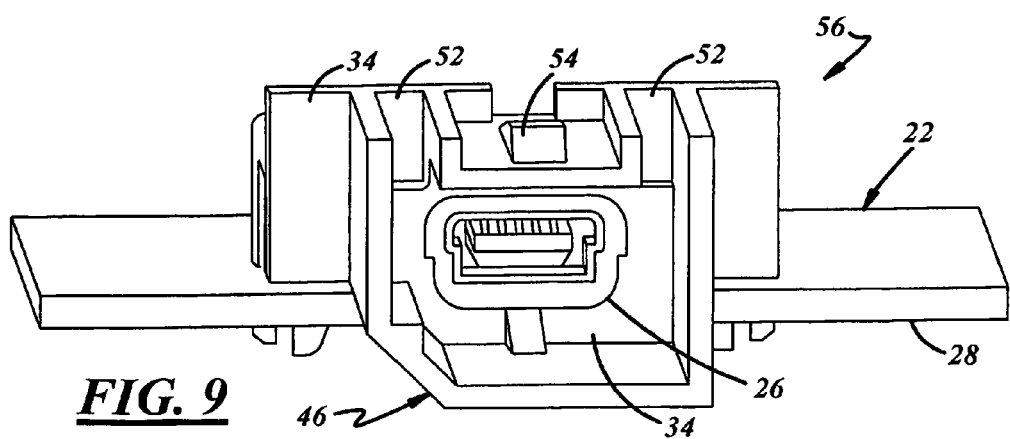
FIG. 9 is a front view of the electronic assembly shown in FIGS. 6 and 7.
Figure 10:
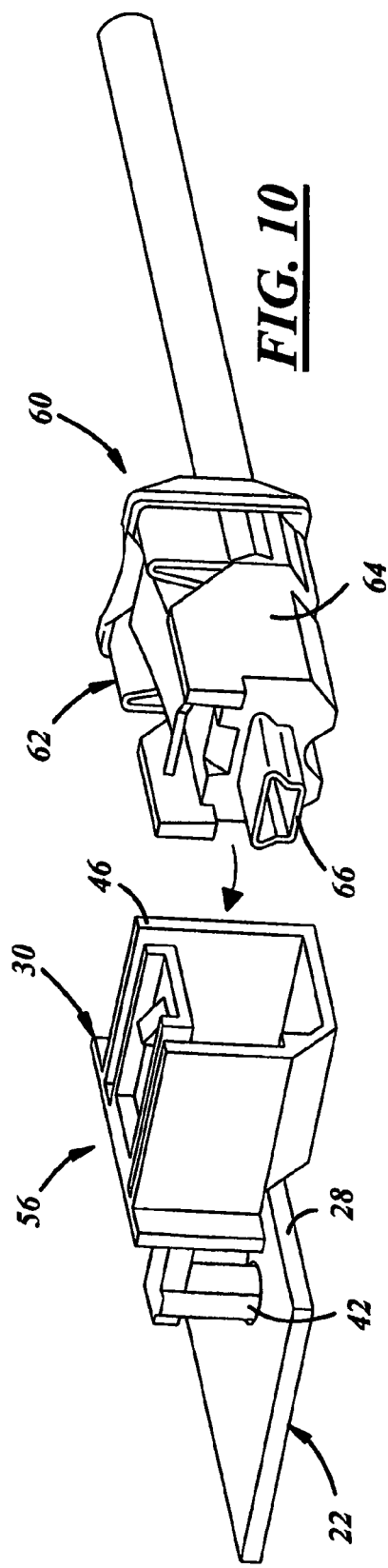
FIG. 10 is a perspective view of the electronic assembly shown in FIGS. 6 and 7 juxtaposed a vehicle wiring having a plug connector.

The forward portion 38 of the plastic component 32 comprises a forward socket 46 that overhands the edge of the printed circuit board 22 as best shown in FIGS. 9 and 10. The socket 46 extends to the medial wall 34 and communicates with the electronic component 20 through a passage in medial wall 34 that leads into the metallic receptacle 26 as best shown in FIG. 9. The forward portion 38 also includes two hooks 48 on respective opposite side of the socket 46 as best shown in FIG. 3. Hooks 48 have angled surfaces 50 that slant downwardly toward the distal ends of the attachment legs 40 of rearward portion 36 for trapping the forward edge 28 of the printed circuit board 22 and fastening the forward portion 38 of the plastic component 32 to the printed circuit board.

The forward socket 46 may have a pair of laterally spaced, substantially parallel channels 52 to provide an indexing feature and a lock nib 54 that is disposed on a upper wall of the forward socket 46 lies between the channels 52.

Figure 4:
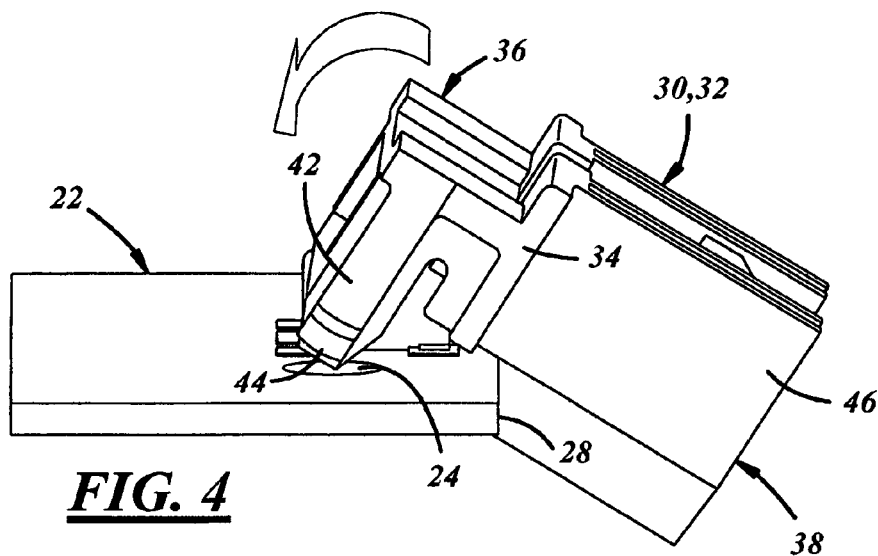
FIG. 4 is a perspective view of the header connector of FIG. 3 further in the process of being attached to the printed circuit board.
Figure 5:
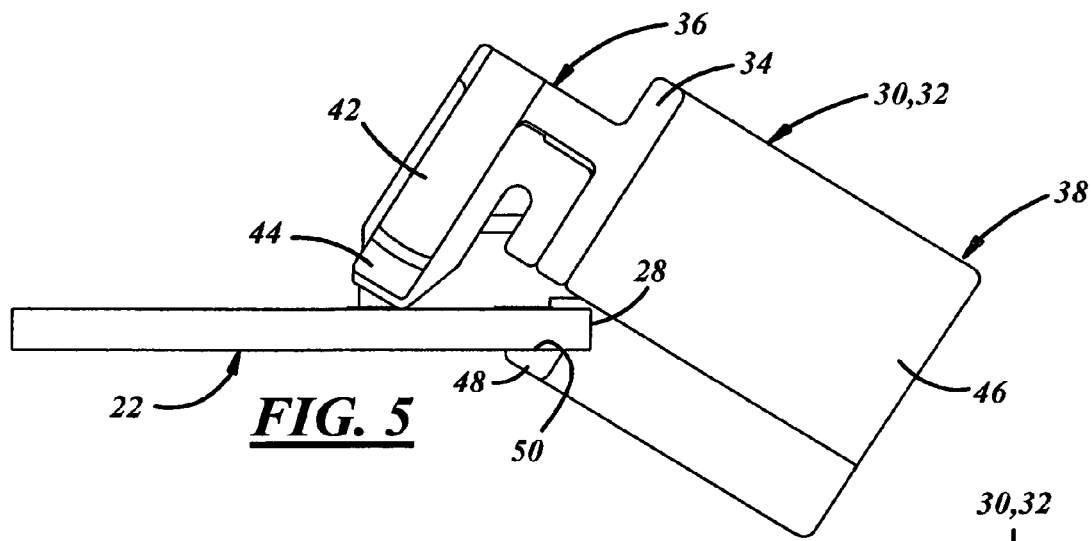
FIG. 5 is a side view of the header connector of FIG. 3 further in the process of being attached to the printed circuit board.

FIG. 3 shows the header connector 30 juxtaposed the sub-assembly comprising printed circuit board 22 and electronic component 20 for assembly to the printed circuit board 22. The header connector 30 is canted at an angle to raise the flexible attachment legs 42 above the printed circuit board 22. The electronic component 20 is then aligned with the bottomless chamber 40 in the rearward portion 36 of the header connector 30, and the forward edge 28 of the printed circuit board 22 is inserted into the open ends of the rearward facing slots partially defined by the sloping surfaces 50 of the hooks 48 as shown in FIGS. 4 and 5.

The header connector 30 is then swung about the forward edge 28 so that the rearward portion 36 of the header connector 30 approaches the printed circuit board 22 and the distal ends of the attachment legs 42 enter the attachment holes 24. The header connector 30 is swung down further until the attachment legs 42 are pushed through the attachment holes 24 and the rearward portion 36 covers the electronic component 20 and rests on the printed circuit board 22. The header connector 30 is now fully seated and locked in place on the printed circuit board 22 to form an electronic assembly 56 as shown in FIGS. 6, 7, 8 and 9.

Figure 6:
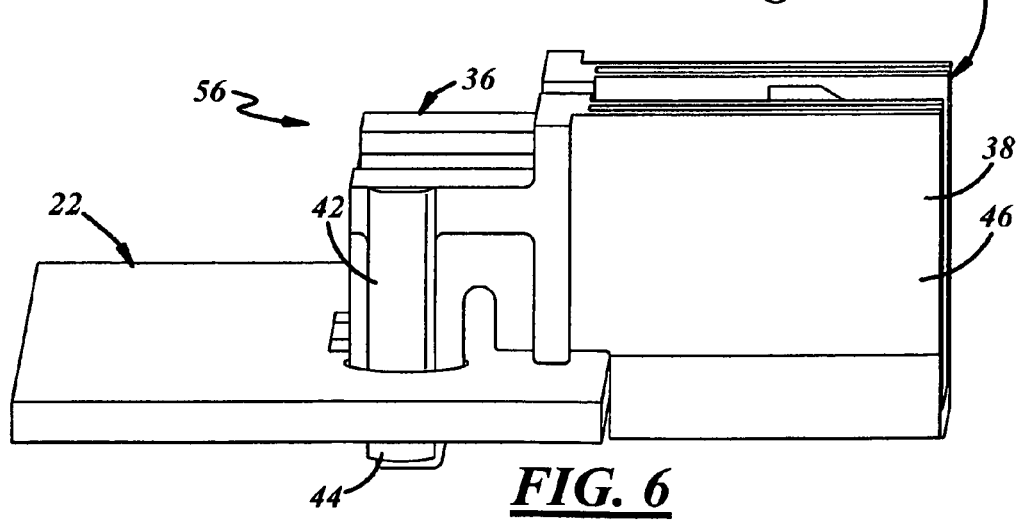
FIG. 6 is a perspective view of the header connector of FIG. 3 fully seated and locked in place on the printed circuit board to form an electronic assembly.
Figure 7:
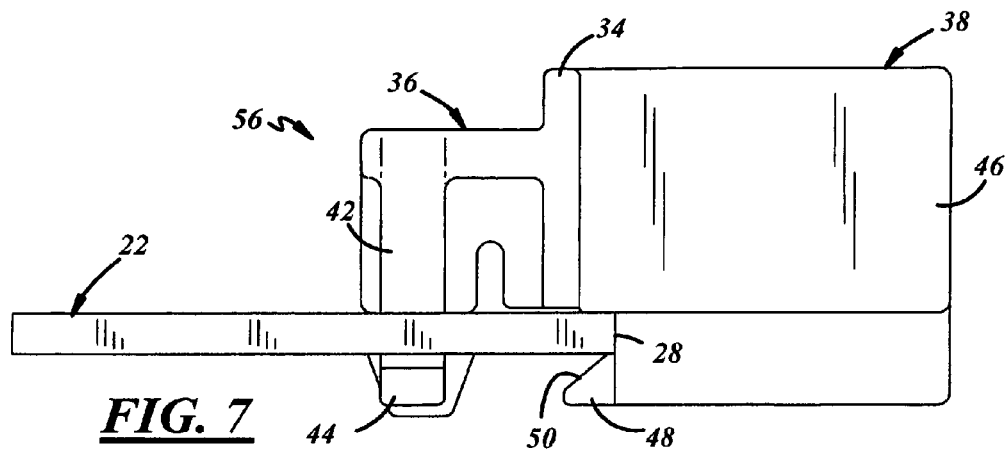
FIG. 7 is a side view of the header connector of FIG. 3 fully seated and locked in place on the printed circuit board to form the electronic assembly.
Figure 11:
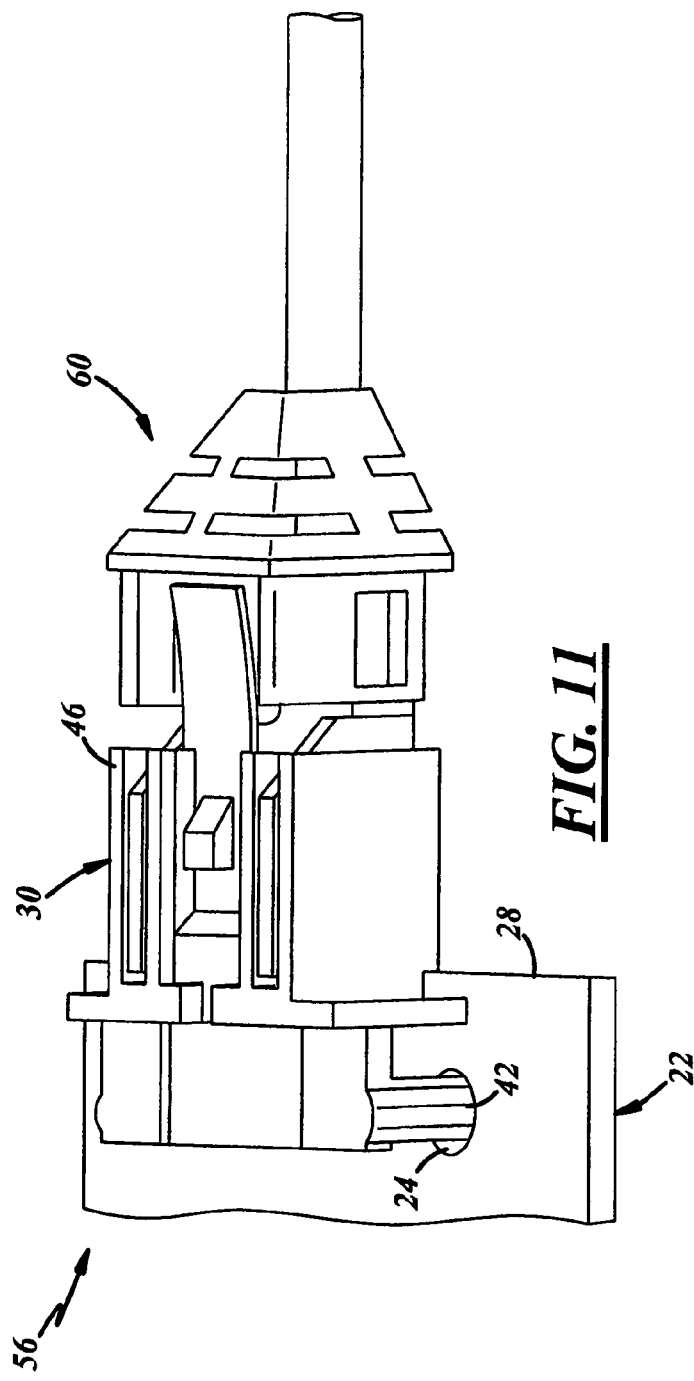
FIG. 11 is a perspective view of the electronic assembly shown in FIG. 10 mated to the plug connector shown in FIG., 10.

FIG. 10 is a perspective view of the electronic assembly 56 shown in FIGS. 6 and 7 juxtaposed an end of a vehicle wiring harness 60 having a plug connector 62 comprising a plastic connector body 64 that plugs into socket 46 and a projecting male part 66 that plugs into receptacle 26 of electronic component 20. FIG. 11 is a perspective view of the electronic assembly 56 shown in FIG. 10 mated to the plug connector 62 shown in FIG. 10.

FIGS. 12 to 19 are various views of a similar electronic assembly 156, its components and/or its sub-assemblies wherein corresponding parts are identified by adding 100 to the corresponding numbers in FIGS. 1-11.

Figure 12:
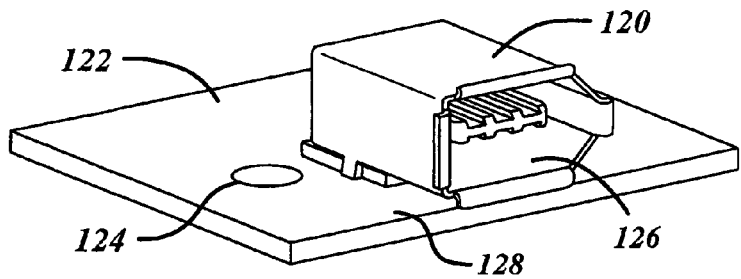
FIGS. 12-19 are supplemental and disclose another electronic assembly similar to that disclosed in connection with FIGS. 1-1.

Referring now to FIG. 12, an electronic component 120 is attached mechanically and electrically to a printed circuit board 122 having solder pads by soldering mounting portions of the electronic component to the solder pads using a solder reflow or other conventional soldering technique. The printed circuit board has two mounting holes 124 near the respective opposite sides of the electronic component 120 and the electronic component 120 has a receptacle 126 that is at or near a front edge 128 of the printed circuit board 122.

Figure 13:
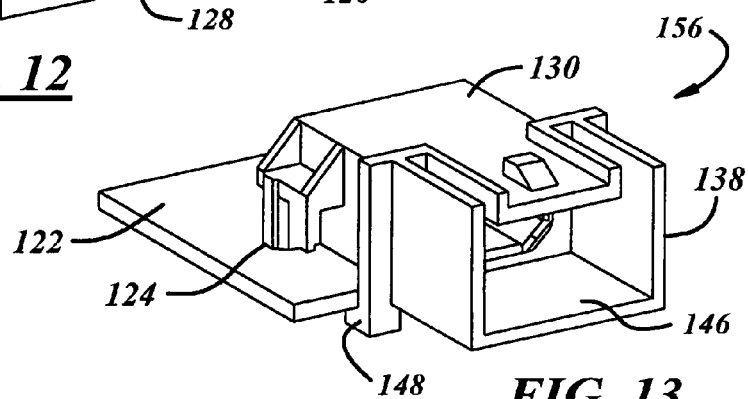

FIG. 13 is a perspective view of a header connector 130 that is attached to the sub-assembly comprising printed circuit board 122 and electronic component 120 shown in FIG. 13 to form the electronic assembly 156. The header connector 130 is a molded plastic component 132 that is attached to the printed circuit board 122 solely by portions of the molded plastic component 132 as explained below.

Figure 15:
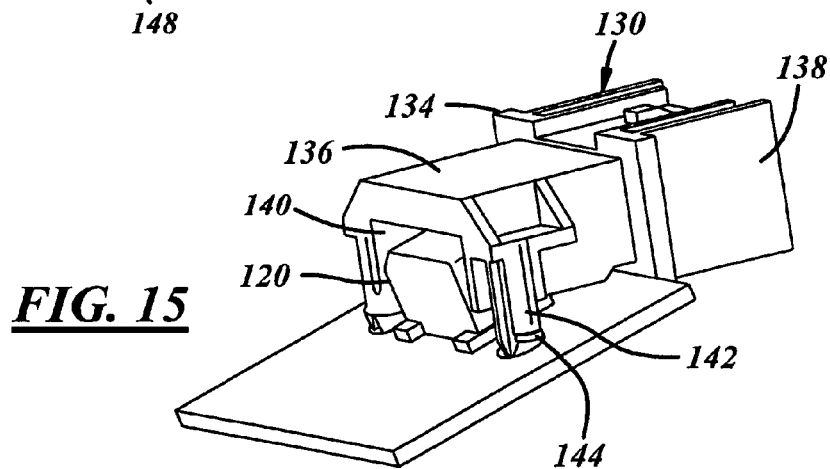

The plastic component 132 comprises a medial wall 134 located between a rearward portion 136 and a forward portion 138. The rearward portion 136 has a bottomless chamber 140 for covering the electronic component 120 and two flexible attachment legs 142 on opposite sides of the bottomless chamber 140 as best shown in FIG. 15. The attachment legs 142 are preferably split longitudinally for flexibility and have lateral wings 144 at their distal ends that are pushed through the attachment holes 124 and engage the underside of the printed circuit board 122 to fasten the rearward portion 136 of the plastic component 132 to the printed circuit board 122.

Figure 16:
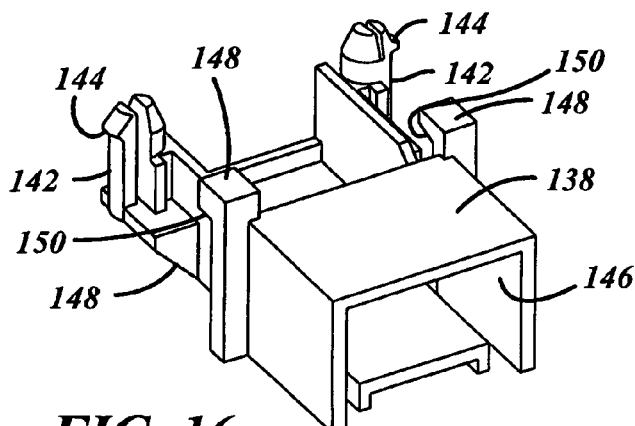
Figure 17:
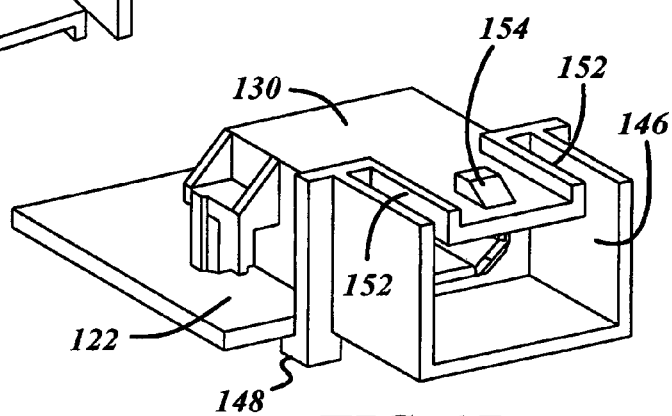
Figure 18:
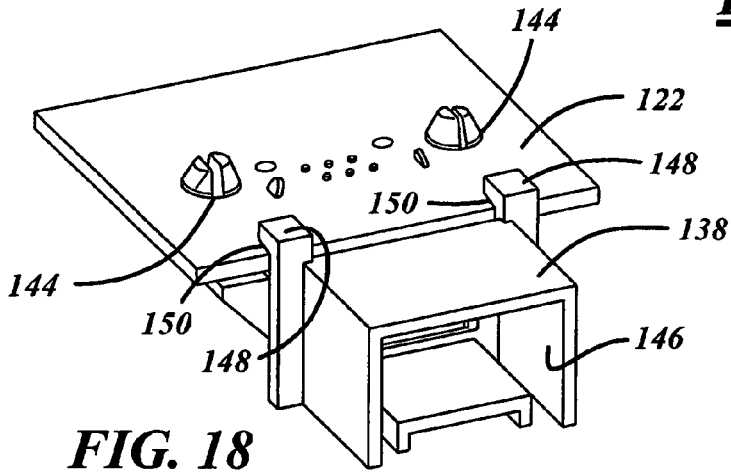

The forward portion 138 of the plastic component 132 comprises a forward socket 146 that overhangs the edge of the printed circuit board 122 as best shown in FIGS. 13, 17, 18 and 19. The socket 146 extends to the medial wall 134 and communicates with the electronic component 120 through a passage in medial wall 134 that leads into the metallic receptacle 126 as best shown in FIGS. 13 and 17. The forward portion 138 also includes two hooks 148 on respective opposite sides of the socket 146 as best shown in FIGS. 16 and 18. Hooks 148 have angled surfaces 150 that slant downwardly toward the distal ends of the attachment legs 142 of rearward portion 136 for trapping the forward edge 128 of the printed circuit board 122 and fastening the forward portion 138 of the plastic component 132 to the printed circuit board 122.

The forward socket 146 may have a pair of laterally spaced, substantially parallel channels 152 to provide an indexing feature and a lock nib 154 that is disposed on a upper wall of the forward socket 146 lies between the channels 152.

The header connector 130 is juxtaposed the sub-assembly comprising printed circuit board 122 and electronic component 120 for assembly to the printed circuit board 122 and canted at an angle to raise the flexible attachment legs 142 above the printed circuit board 122. The electronic component 120 is then aligned with the bottomless chamber 140 in the rearward portion 136 of the header connector 130, and the forward edge 128 of the printed circuit board 122 is inserted into the open ends of the rearward facing slots partially defined by the sloping surfaces 150 of the hooks 148 just as in the case of header connector 30 shown in FIG. 3.

Figure 14:
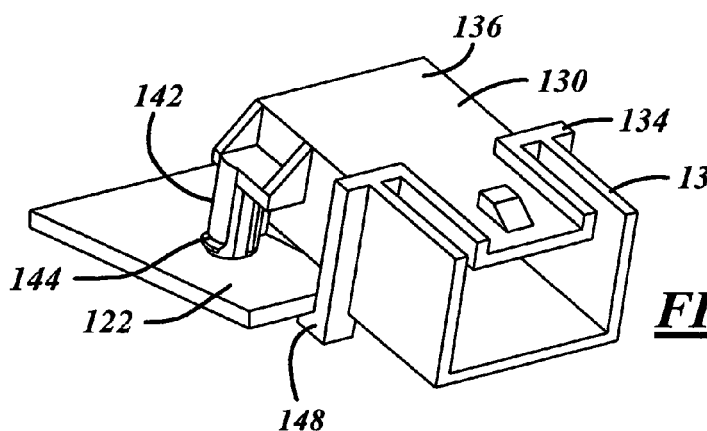
Figure 19:
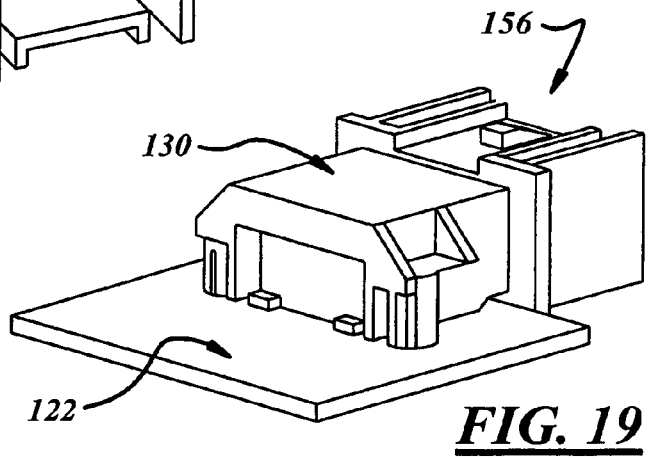

The header connector 130 is then swung about the forward edge 128 so that the rearward portion 136 of the header connector 130 approaches the printed circuit board 122 and the distal ends of the attachment legs 142 enter the attachment holes 124 as shown in FIGS. 14 and 15. The header connector 130 is swung down further until the attachment legs 142 are pushed through the attachment holes 124 and the rearward portion 136 covers the electronic component 120 and rests on the printed circuit board 122 as shown in FIGS. 17, 18 and 19. The header connector 130 is now fully seated and locked in place on the printed circuit board 122 to form the electronic assembly 156 as shown in FIGS. 13, 17, 18 and 19.

The electronic assembly 156 may be attached to an end of a vehicle wiring harness 60 having a plug connector 62 comprising a plastic connector body 64 (FIG. 10) that plugs into socket 146 and a projecting male part 66 that plugs into receptacle 126 of electronic component 120.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. An electronic assembly, comprising:
   a printed circuit board including a front edge;
   an electronic component soldered to the printed circuit board at a soldering temperature; and
   a plastic only, non-electrical header connector formed of a low temperature plastic material having a melting point below said soldering temperature, the header connector including a hook portion defining a slot and an at least one attachment leg having a distal wing,
   wherein the front edge of the printed circuit board is inserted into the slot thereby allowing the hook portion to make contact the printed circuit board such that the header connecter is canted above the printed circuit board and positionally swung down toward the printed circuit board such that the header connector overlies at least a portion of the attached electronic component and is secured to the printed circuit board by the wing of the at least one attachment leg;

wherein the electronic component has a receptacle and the plastic header connector has a forward socket portion and a rearward portion including a chamber, the receptacle adapted to receive an electrical connector through the forward socket portion to electrically communicate with the electronic component and the chamber being adapted to overlie at least the portion of the electronic component; and wherein the forward socket portion overhangs the edge of the printed circuit board.

2. The electronic assembly as defined in claim 1 wherein the hook portion traps an edge of the printed circuit board and the header connector further includes an attachment leg, said leg extends through an attachment hole disposed in the printed circuit board to trap a portion of the printed circuit board adjacent the attachment hole.

3. The electronic assembly as defined in claim 1 wherein an attachment leg of the header connector is rearward of the hook portion.

4. The electronic assembly as defined in claim 1 wherein the hook portion includes an angled surface extending from an outer surface of the header connector sloping downwardly away in a direction toward a distal end of an attachment leg, said angled surface being disposed along a substantial portion of a length of the hook portion.

5. A method of making an electronic assembly comprising the steps of:

soldering an electronic component to a printed circuit board at a soldering temperature so that the electronic component has a front surface near a front edge of the printed circuit board and is disposed near at least one attachment hole that extends through the printed circuit board, providing a plastic only, non-electrical header connector having a hook portion and an attachment leg rearward of the hook portion, inserting the front edge of the printed circuit board into a slot of the plastic only header connector defined in part by the hook portion so that the header connector is canted at an angle to the printed circuit board such that the attachment leg overlies the at least one attachment hole in the printed circuit board, and swinging the plastic only header connector downwardly toward the soldered electronic component on the printed circuit board so that the attachment leg extends through the at least one attachment hole in the printed circuit board to only mechanically secure the plastic only header connector to the printed circuit board such that the header connector overlies the soldered electronic component, wherein the steps of providing the header connector and inserting the front edge of the printed circuit board and swinging the plastic only header connector downwardly toward the soldered electronic component occur after and separate from the step of soldering the electronic component to the printed circuit board, and the header connector is formed of a low temperature plastic material having a melting point below the soldering temperature;

mechanically securing the header connector to the printed circuit board solely by a wing disposed on a distal end of said extended attachment leg; and wherein the step of providing said header connector further includes the header connector comprising a forward socket portion and a rearward portion, said forward socket portion overhangs the front edge of the printed circuit board and the rearward portion includes a chamber that overlies at least a portion of the attached electronic component after the step of swinging the plastic only header connector.

6. The method of claim 5 wherein the step of soldering the electronic component further includes the electronic component being soldered to the printed circuit board so that the electronic component is disposed between two attachment holes that extend through the printed circuit board, wherein the plastic header connector has two hook portions and two attachment legs rearward of the hook portions, wherein the front edge of the printed circuit board is inserted into slots of the plastic header connector defined in part the hook portions and wherein the header connector is swung downwardly toward the printed circuit board so that the two attachment legs extend through the two attachment holes in the printed circuit board to secure the plastic only header connector to the printed circuit board.

7. The electronic assembly as defined in claim 2, wherein the hook portion comprises at least two hook portions and the attachment leg comprises at least two attachment legs and the attachment hole comprises at least two attachment holes to receive the respective at least two attachment legs.

8. The method according to claim 5, wherein the step of inserting the slot of the header connector further includes said angle being in relation to a slope of an angled surface of the hook portion when the angled surface makes contact with the printed circuit board.

9. The method according to claim 5, further including, mating an electrical connector to the soldered electronic component through the header connector.

\* \* \* \* \*